(12) United States Patent
Yu

(10) Patent No.: US 6,433,979 B1
(45) Date of Patent: Aug. 13, 2002

(54) ELECTROSTATIC DISCHARGE PROTECTION DEVICE USING SEMICONDUCTOR CONTROLLED RECTIFIER

(75) Inventor: Ta-Lee Yu, Hsinchu Hsien (TW)

(73) Assignee: Taiwan Semiconductor Manufacturing Co., Hsinchu (TW)

(*) Notice: Subject to any disclaimer, the term of this patent is extended or adjusted under 35 U.S.C. 154(b) by 0 days.

(21) Appl. No.: 09/487,527

(22) Filed: Jan. 19, 2000

(51) Int. Cl.[7] ................................................ H02H 9/00
(52) U.S. Cl. ........................ 361/56; 361/111; 361/118; 361/119
(58) Field of Search ............................ 361/56, 58, 111, 361/118, 119, 127

(56) References Cited

U.S. PATENT DOCUMENTS 5,400,202 A * 3/1995 Metz et al. .................... 361/56
5,932,918 A * 8/1999 Krakauer ..................... 257/368

* cited by examiner

Primary Examiner—Stephen W. Jackson
(74) Attorney, Agent, or Firm—Baker Botts L.L.P.

(57) ABSTRACT

A novel electrostatic discharge (ESD) protection device used for mixed voltage application is disclosed. Semiconductor-controlled rectifier (SCR) is utilized as the basic protection device for ESD current bypass. MOS transistors are stacked in a cascode configuration with at least two transistors to reduce the trigger voltage of the SCR for the mixed voltage modification. None of the voltage across any gate dielectric exceeds low supply level. The dielectric and hot carrier reliability of the MOS transistors can thus be ensured.

26 Claims, 9 Drawing Sheets

ELECTROSTATIC DISCHARGE PROTECTION DEVICE USING SEMICONDUCTOR CONTROLLED RECTIFIER

FIELD OF THE INVENTION

The present invention relates to an electrostatic discharge (ESD) protection circuit for protecting an integrated circuit from damaging by electrostatic discharge, and more especially, to an ESD protection circuit using semiconductor controlled rectifier (SCR) for mixed voltage application.

BACKGROUND OF THE INVENTION

Electrostatic discharge (ESD) phenomena, which normally occur on integrated circuits (ICs) when touched by charged human body or machines, have a grown importance in electric and semiconductor industry. Due to the extreme high-energy electrical pulse caused, the electrostatic discharges could damage the integrated circuit badly. As the semiconductor technologies tend to reducing device dimension and increasing circuit integration, the potentially destructive nature of ESD became more and more apparent. To prevent the ICs form failure by unexpected damage, the ESD phenomena should be suppressed, and protection circuits are often employed against ESD in addition to anti-static coatings to protect the primary circuit elements on IC chips.

In general, the ESD protection circuits for an IC chip are coupling to the contact ports, which typically refer to as pins or inputs/output pads, of the chip needed for protection. An ESD protection circuit is a bypass of the primary circuit and constructed with a trigger voltage at which a key junction enters avalanche breakdown and the bypass of protection circuit shorts to allow a great amount of current passing through and shunted to electrical ground. After the ESD protection circuit is triggered, a low impedance mode called snap-back occurs so that the bypassed current can flow through the protection circuit under a holding voltage that is much lower than the trigger voltage. The primary circuit is thus prevented from experience of ESD current.

An important conventional ESD protection circuit is semiconductor-controlled rectifier (also refer to as silicon controlled rectifier, SCR). FIG. 1 shows a typical lateral SCR (LSCR) protection circuit in cross-sectional view of a wafer. The conventional LSCR is typically constructed in a P-type doped substrate 10 with an N-type doped well region 20 formed therein. A heavily doped P-type region 30 is formed in the N-type well region 20 to serve as the anode of the LSCR, and a heavily doped N-type region 40 is formed in the P-type substrate 10 outside the N-type well region 20 to serve as the cathode. Contact regions of the P-type substrate 10 and N-type well region 20 can be optionally formed as the P-type and N-type heavily doped regions 50 and 60 respectively. In this structure, N-type region 20 is interposed between P-type regions 10 and 30 while the P-type region 10 is interposed between N-type regions 20 and 40.

This LSCR device acts as a switch when a bias is provided with the anode potential positive with respect to the cathode potential. As the provided bias is at the normal operating level of the primary circuit, only leakage current flows through the LSCR device because the junction 15 between the N-well 20 and P-type substrate 10 is reverse biased. The LSCR is now considered to be "off". As the added bias is raised positively beyond a certain level, which refers to as trigger voltage mentioned above, the junction 15 enters avalanche breakdown and a large number of electron-hole pairs are generated. This results in constructive feedback and allows a great current passes through the junction as well as the LSCR, at a holding level much lower than the trigger voltage. The LSCR switch is now "on" to bypass the ESD current and prevent the components of the primary circuit from damage.

Above conventional LSCR devices used for ESD protection encounter a problem about their high trigger voltage, which is typically around tens of volts, because they must be triggered beyond the breakdown voltage of junction 15. A variety of circuit structures, which are desired for protection from ESD effect, may be damaged at the level below the trigger voltage of these LSCRs. A low voltage triggering SCR (LVTSCR) structure is thus developed to reduce the trigger voltage and thus increase the protection range.

FIG. 2 displays a cross-sectional view of a typical LVTSCR structure used for ESD protection. The typical LVTSCR substantially keeps all the LSCR's elements and retains their related configuration as illustrated in FIG. 1. Three additional elements appear. A heavily doped N-type region 70 is formed at the boundary of P-type substrate 10 and N-type well region 20. Gate oxide film 80 and gate electrode 90 are stacked on the substrate 10 between the two N-type doped regions 40 and 70 to form an NMOS transistor 100 with the N-type doped regions 40 and 70 as the source and drain regions. As can be seen in FIG. 2, a LVTSCR is formed with a LSCR coupling to an NMOS transistor at a common region, that is, the N-type doped region 40 in FIG. 2.

In the LVTSCR structure, the gate electrode 90 of the NMOS transistor 100 is electrically connected to N-type doped region 40 so that the transistor 100 is normally not conducting. As the bias of the anode with respect to cathode rises, the NMOS transistor 100 enters breakdown prior to junction 15, and thus the LVTSCR is triggered by the NMOS breakdown current at approximately the breakdown voltage of the NMOS transistor 100 instead of the breakdown voltage of junction 15. For that the former breakdown voltage is typically much lower than the latter one as a result of the modern semiconductor fabrication technology, the trigger voltage of the LVTSCR is thus significantly reduced.

However, there are still some issues, such as the mixed voltage application, that must be considered when the LVTSCR devices are applied to ESD protection circuit. As known in the art, integrated circuits, as well as computer systems were designed historically to operate under five-volt power supply. As the electric and semiconductor fabrication technology progresses, and the application market develops, lower power consumption and higher device performance are required. Lower voltage standards were then introduced. A 3.3-volt system is employed.

The new lower voltage standard were not immediately fully adopted for all applications. Devices having new standard power supply are frequently used together with those having old standard power supply. Sometimes it is needed to make new, low-voltage devices interconnected to old, high-voltage devices. For such a mixed voltage system, it must be ensured that the circuit designed to operate at lower voltage standard would not be harmed when used in the high voltage application. However, in this case, the conventional LVTSCR manufactured for protecting the low-voltage device would face a high standard voltage across the thin gate oxide of the NMOS transistor thereof. Since the LVTSCR is employed for the low-voltage protection and generally fabricated simultaneously as the protected circuit formed, the gate oxide is not designed for withstanding the high standard voltage. The high standard voltage across the gate oxide would generate strong field, increase hot carriers, and result in degradation of oxide reliability and shortening of oxide lifetime (before oxide breakdown). Therefore, an effective ESD protection device fit for mixed voltage application is sought.

SUMMARY OF THE INVENTION

The present invention proposes a novel electrostatic discharge (ESD) protection circuit used for mixed voltage application. This ESD protection circuit utilized semiconductor-controlled rectifier (SCR) as the basic protection device for ESD current bypass. A lateral semiconductor-controlled rectifier (LSCR) or a floating well SCR can be chosen. In addition, N+ guard band in the N-well region or P+ guard band in P-type substrate can be optionally adopted for higher trigger current and increasing latch-up margin.

MOS transistors are employed to reduce the trigger voltage of the SCR. The MOS transistors are stacked in a cascode configuration with at least two transistors for the mixed voltage modification. With such a stacked MOS structure, none of the voltage between the gate-source, gate-drain, and source-drain terminals of any stacked transistor exceeds low supply level. The dielectric and hot carrier reliability of the MOS transistors can thus be ensured.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a novel electrostatic discharge (ESD) protection device used for mixed voltage application. This ESD protection circuit utilized semiconductor-controlled rectifier (SCR) as the basic protection device for ESD current bypass. NMOS transistor devices are employed to reduce the trigger voltage of the SCR. Furthermore, stacked MOS structure in a cascode configuration is adopted for the mixed voltage modification.

Figure 1:
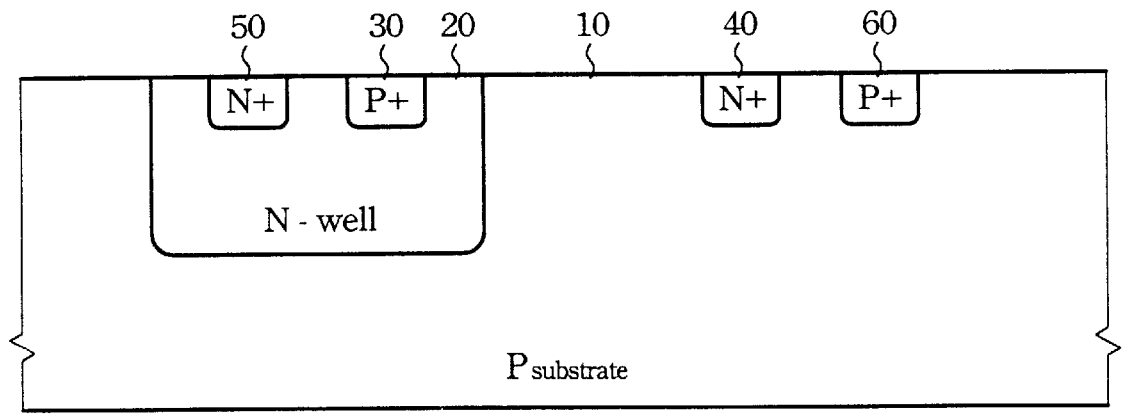
FIG. 1 is a cross-sectional view of a semiconductor wafer illustrating a lateral SCR (LSCR) according to the prior art.
Figure 2:
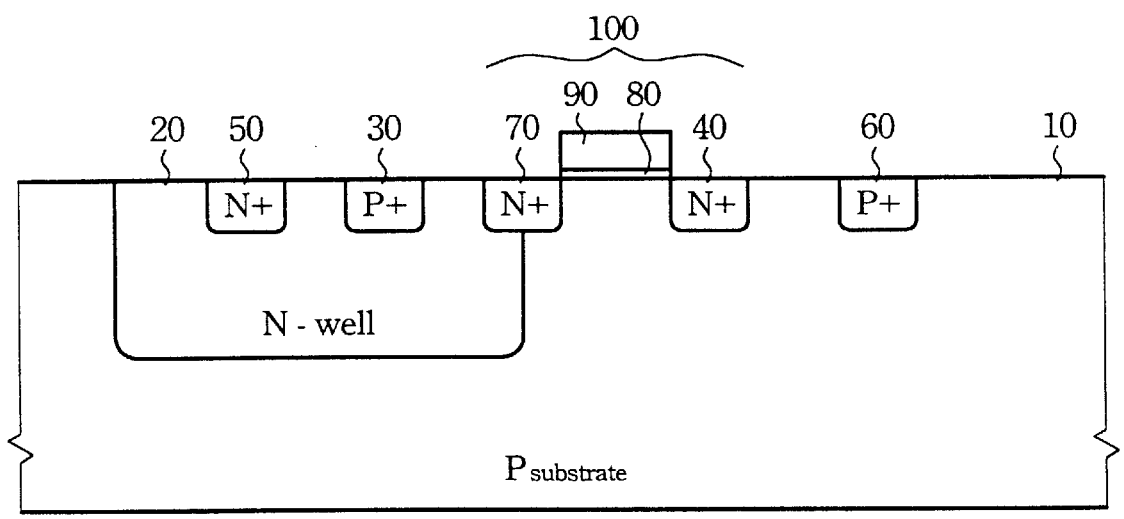
FIG. 2 is a cross-sectional view of a semiconductor wafer illustrating a low voltage triggering SCR (LVTSCR) according to the prior art.
Figure 3A:
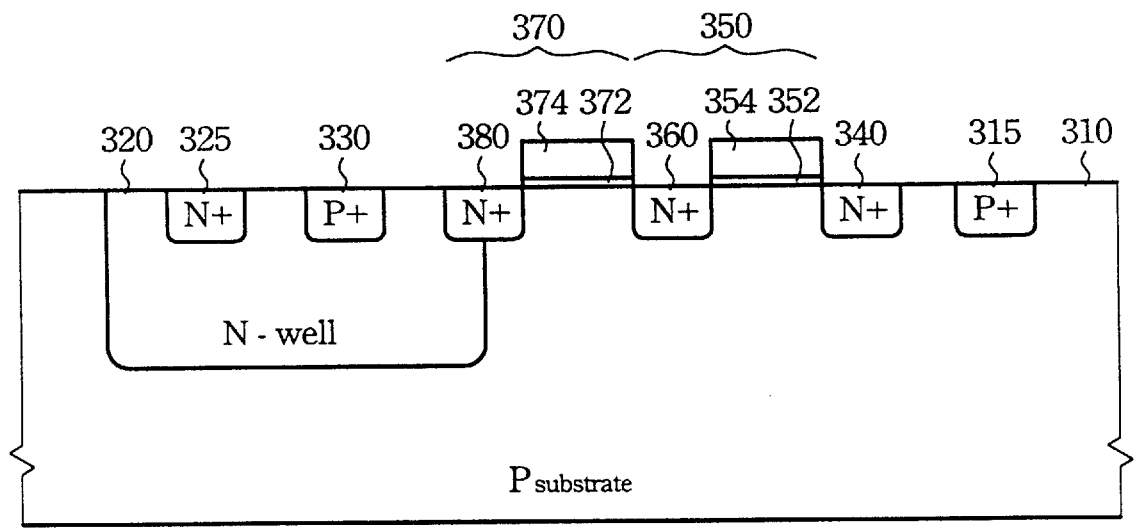
FIG. 3A is a cross-sectional view of a semiconductor wafer illustrating the ESD protection device according to the first embodiment of the present invention.

FIG. 3A illustrates the first embodiment of the present invention in cross-sectional view of a wafer. A P-type doped substrate 310 is provided with an N-type doped well region 320 formed therein. A contact region of the P-type substrate 310 can be optionally formed as the P-type heavily doped region 315, and a contact region of the N-type well region 320 can be optionally formed as the N-type heavily doped region 325. A heavily doped P-type region 330 is formed in the N-type well region 320 to serve as an anode. A heavily doped N-type region 340 is formed in the P-type substrate 310 outside the N-type well region 320 to serve as a cathode. The anode and cathode 330 and 340 are disposed such that N-type region 320 is interposed between P-type regions 310 and 330 while the P-type region 310 is interposed between N-type regions 320 and 340. A LSCR structure is thus formed.

A stacked MOS structure with at least two NMOS transistors 350 and 370 is formed in a cascode configuration on the substrate with the N-type cathode region 340 as a source of the first NMOS transistor 350. These two NMOS transistors 350 and 370 are merged into the same active area and share a common N-type doped region 360 as the drain of the first NMOS transistor 350 as well as the source of the second NMOS transistor 370. The heavily doped N-type drain region 380 of the second transistor 370 is formed at the boundary of the N-type well region 320 and P-type substrate 310. Stacked dielectric film 352 and conductive film 354 are formed on the substrate between regions 340 and 360 to serve as the gate dielectric and gate electrode of the first transistor 350. Stacked dielectric film 362 and conductive film 364 are formed on the substrate between regions 360 and 380 to serve as the gate dielectric and gate electrode of the second transistor 370.

Figure 3B:
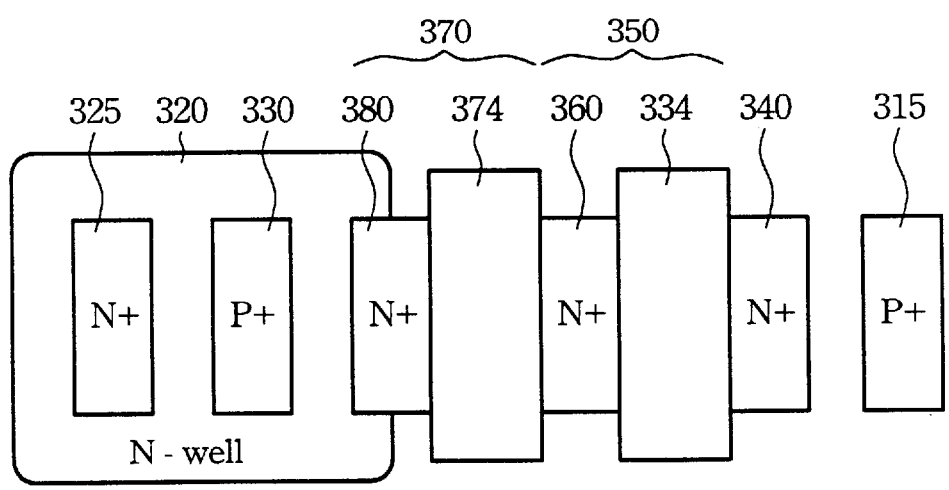
FIG. 3B is a top view of a semiconductor wafer illustrating the ESD protection device according to the first embodiment of the present invention.
Figure 3C:
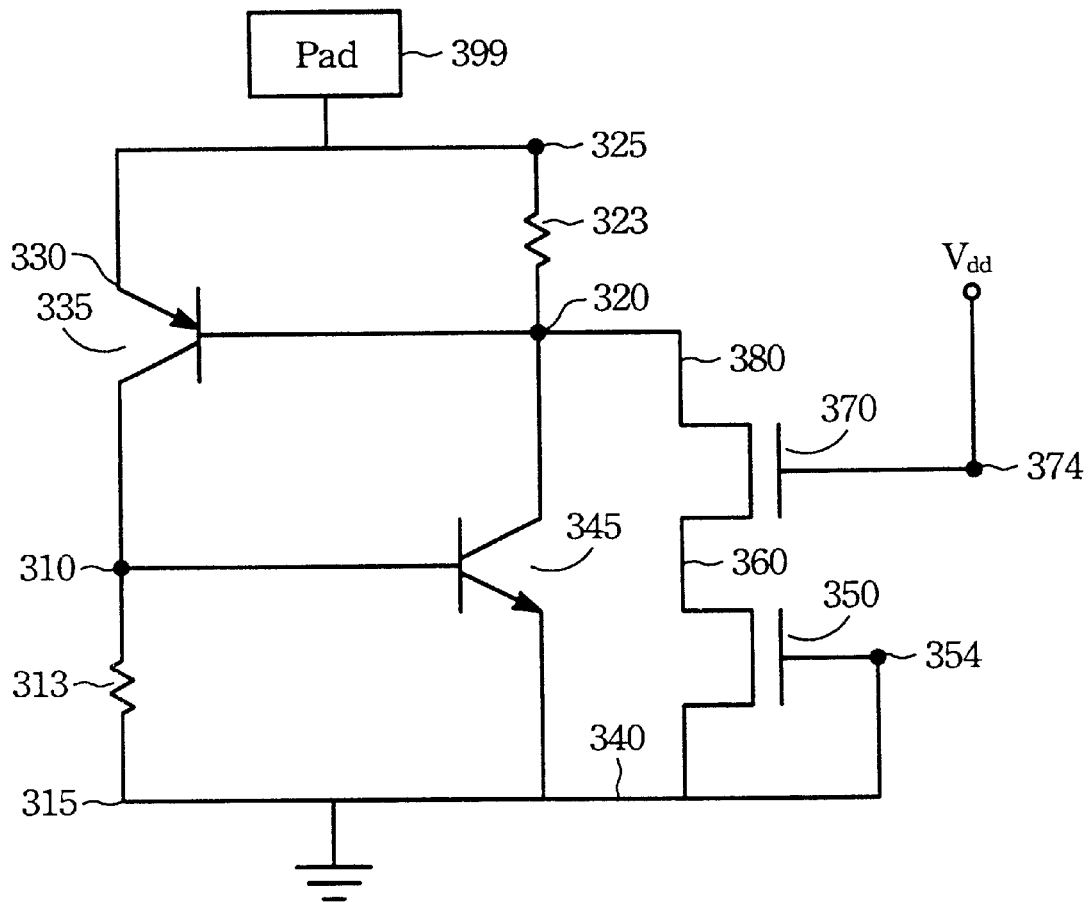
FIG. 3C is the circuit schematic diagram of the ESD protection device according to the first embodiment of the present invention.

FIG. 3B displays a top view of above first embodiment of the mixed voltage ESD protection device. Elements labeled in FIG. 3A are identified and shown except the two gate oxide films 352 and 372, which are lying right beneath the gate electrodes 354 and 374 respectively. The equivalent circuit schematic diagram of the first embodiment is illustrated in FIG. 3C. The LSCR is represented by PNP bipolar transistor 335 and NPN bipolar transistor 345 in a constructive feedback configuration. The P-type substrate 310, N well 320 and P-type anode region 330 respectively serve as the collector, base, and emitter of the PNP bipolar transistor 335. Similarly, the N well 320, P-type substrate 310 and N-type cathode region 340 respectively serve as the collector, base, and emitter of the NPN bipolar transistor 345.

Resistor 313 is contributed by the junction between the P-type substrate 310 and the substrate contact region 315. Resistor 323 is contributed by the junction between the N-type well 320 and the N-well contact region 325. The two NMOS transistors 350 and 370 are stacked in cascode configuration with the source of the first NMOS transistor 350 coupling to the emitter of the NPN bipolar transistor 345 and the drain 380 of the second NMOS transistor 370 coupling to the base 320 of the PNP bipolar transistor 335.

When applied to protect a primary circuit from ESD, this ESD protection circuit can be connected as follows. The anode of this protection device, including the emitter 330 of the bipolar transistor 335 and the N-well contact region 325, is connected to the I/O pad 399. The cathode, including the P-type substrate contact region 315 and the common N-doped region 340 for both LSCR and the stacked MOS structure, is grounded, or saying, tired to Vss. The gate 354 of the first NMOS transistor 350 is also grounded. The gate 374 of the second NMOS transistor 370 is coupling to the low supply voltage (Vdd), either directly or through a transistor network.

With the configuration illustrated in FIGS. 3A, 3B, 3C, the ESD protection device proposed by the present invention can function in the ESD event and still meet the dielectric and hot carrier reliability limits at a high supply voltage level. During an ESD event, the stacked MOS structure enters avalanche breakdown when the bias across the LSCR between anode and cathode raised beyond the trigger voltage. A bipolar effect takes place between the source 340 of the first transistor 350 and drain 380 of the second transistor 370 at this moment. These two regions act as bipolar emitter and collector respectively, and a breakdown current is generated. The breakdown current triggers the LSCR, and a bypass is turned on allowing the ESD current to flow through. The protected primary circuit is prevented from ESD damage. The breakdown voltage of the stacked MOS structure and hence the trigger voltage of the protection device can be adjusted by the total channel length of the stacked MOS structure.

Instead, when a signal of high supply voltage about 5 volts is received between the anode and cathode, the drain 380 of the second NMOS transistor 370 is at a voltage a little less than 5 volts. With the gates of the first NMOS transistor 350 and second NMOS transistor 370 are respectively grounded and tired to low supply voltage Vdd, which is approximate 3.3 volts, the voltage of the shared source/drain region 360 is limited to the low supply voltage minus the threshold voltage of the transistor 370. In such voltage distribution, none of the voltage between the gate-source, gate-drain, and source-drain terminals of either transistor exceeds 3.3 volts. No dielectric and hot carrier reliability is challenged.

Figure 4A:
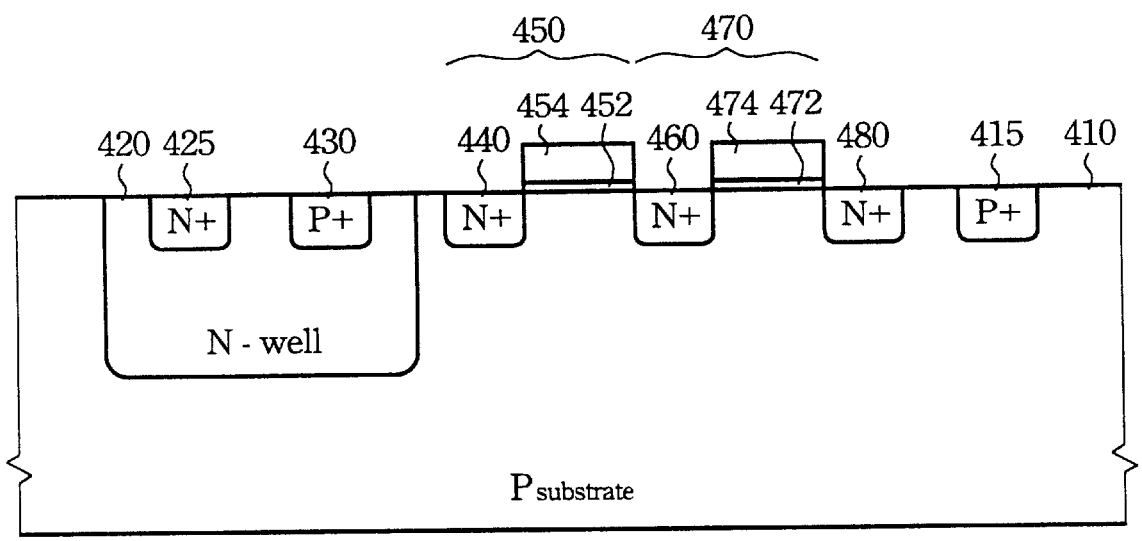
FIG. 4A is a cross-sectional view of a semiconductor wafer illustrating the ESD protection device according to the second embodiment of the present invention.

FIG. 4A illustrates the second embodiment of the present invention in cross-sectional view of a wafer. A P-type doped substrate 410 is provided with an N-type doped well region 420 formed therein. A contact region of the N-type well region 420 can be optionally formed as the N-type heavily doped region 425, and a contact region of the P-type substrate 410 can be optionally formed as the P-type heavily doped region 415. A heavily doped P-type region 430 is formed in the N-type well region 420 to serve as an anode. A heavily doped N-type region 440 is formed in the P-type substrate 410 outside the N-type well region 420 to serve as the cathode. The anode and cathode 430 and 440 are disposed such that N-type region 420 is interposed between P-type regions 410 and 430 while the P-type region 410 is interposed between N-type regions 420 and 440. A LSCR structure is thus formed.

A stacked MOS structure with at least two NMOS transistors 450 and 470 is formed in a cascode configuration on the substrate with the N-type anode region 440 as a source of the first NMOS transistor 450. These two NMOS transistors 450 and 470 are merged into the same active area and share a common N-type doped region 460 as the drain of the first NMOS transistor 450 as well as the source of the second NMOS transistor 470. The heavily doped N-type drain region 480 of the second transistor 470 is formed in the P-type substrate 410 such that the NMOS transistors 450 locates between the N-type well region 420 and N-type drain region 480. Stacked dielectric film 452 and conductive film 454 are formed on the substrate between regions 440 and 460 to serve as the gate dielectric and gate electrode of the first transistor 450. Stacked dielectric film 472 and conductive film 474 are formed on the substrate between regions 460 and 480 to serve as the gate dielectric and gate electrode of the second transistor 470.

Figure 4B:
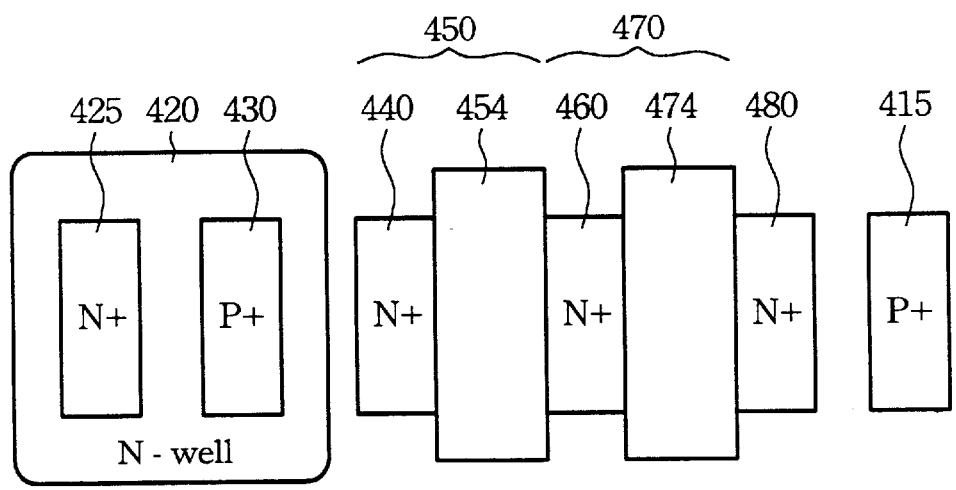
FIG. 4B is a top view of a semiconductor wafer illustrating the ESD protection device according to the second embodiment of the present invention.
Figure 4C:
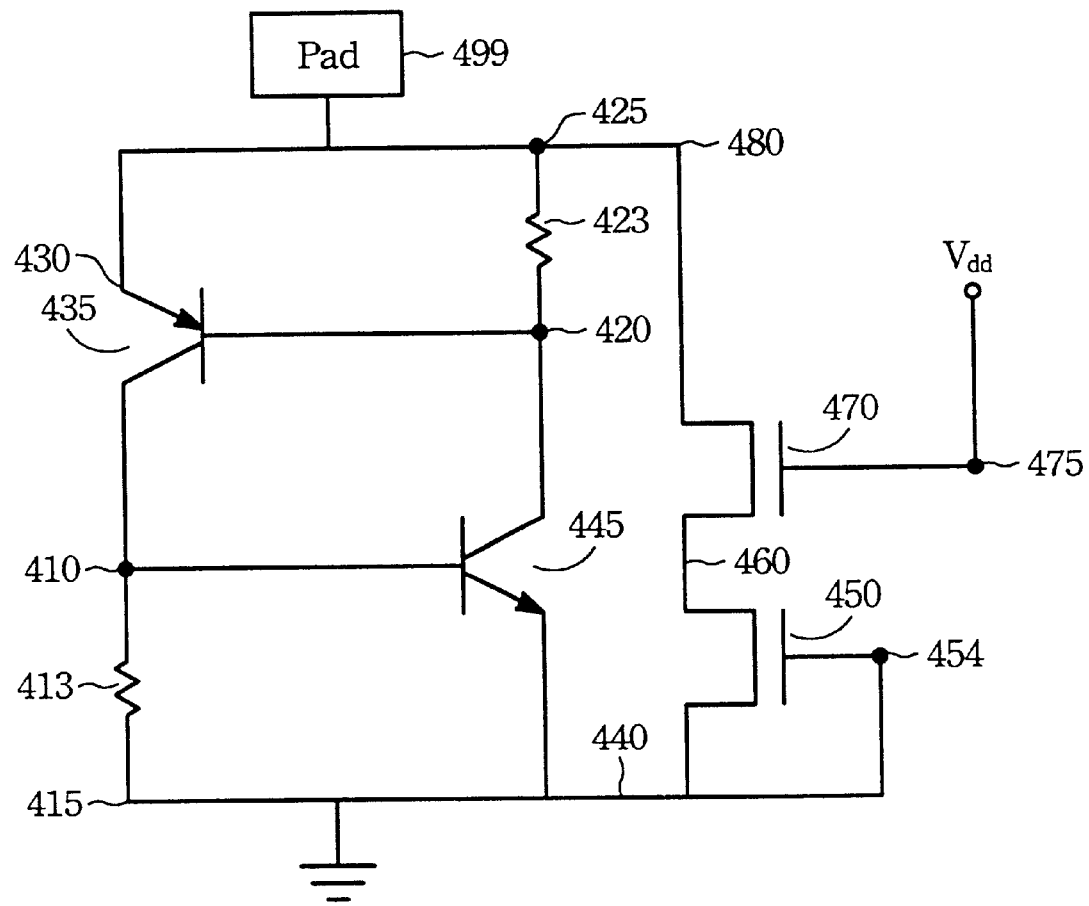
FIG. 4C is the circuit schematic diagram of the ESD protection device according to the second embodiment of the present invention.

FIG. 4B displays a top view of above second embodiment of the mixed voltage ESD protection device. Elements labeled in FIG. 4A are identified and shown except the two gate oxide films 452 and 472, which are lying right beneath the gate electrodes 454 and 474 respectively. The equivalent circuit schematic diagram of the second embodiment is illustrated in FIG. 4C. The LSCR is represented by PNP bipolar transistor 435 and NPN bipolar transistor 445 in a constructive feedback configuration. The P-type substrate 410, N well 420 and P-type anode region 430 respectively serve as the collector, base, and emitter of the PNP bipolar transistor 435. Similarly, the N well 420, P-type substrate 410 and N-type anode region 440 respectively serve as the collector, base, and emitter of the NPN bipolar transistor 445.

Resistor 413 is contributed by the junction between the P-type substrate 410 and the substrate contact region 415. Resistor 423 is contributed by the junction between the N-type well 420 and the N-well contact region 425. The two NMOS transistors 450 and 470 are stacked in cascode configuration with the source of the first NMOS transistor 450 coupling to the emitter of the NPN bipolar transistor 445 and the drain 480 of the second NMOS transistor 470 coupling to the emitter 430 of the PNP bipolar transistor 435.

When applied to protect a primary circuit from ESD, this ESD protection circuit can be connected as follows. The anode of this protection device, including the emitter 430 of the bipolar transistor 435, the N-well contact region 425, and the drain 480 of the second NMOS transistor 470, is connected to the I/O pad 499. The cathode, including the P-type substrate contact region 415 and the common N-doped region 440 for both LSCR and the stacked MOS structure, is grounded. The gate 454 of the first NMOS transistor 450 is also grounded. The gate 474 of the second NMOS transistor 470 is coupling to the low supply voltage (Vdd), either directly or through a transistor network. The stacked MOS structure in this embodiment is used as an output buffer. This output buffer serves as trigger current source to trigger the SCR on during an ESD event. With the configuration illustrated in FIGS. 4A, 4B, and 4C, the ESD protection device proposed by the present invention can function in the ESD event and still meet the dielectric and hot carrier reliability limits at a high supply voltage level.

Figure 5A:
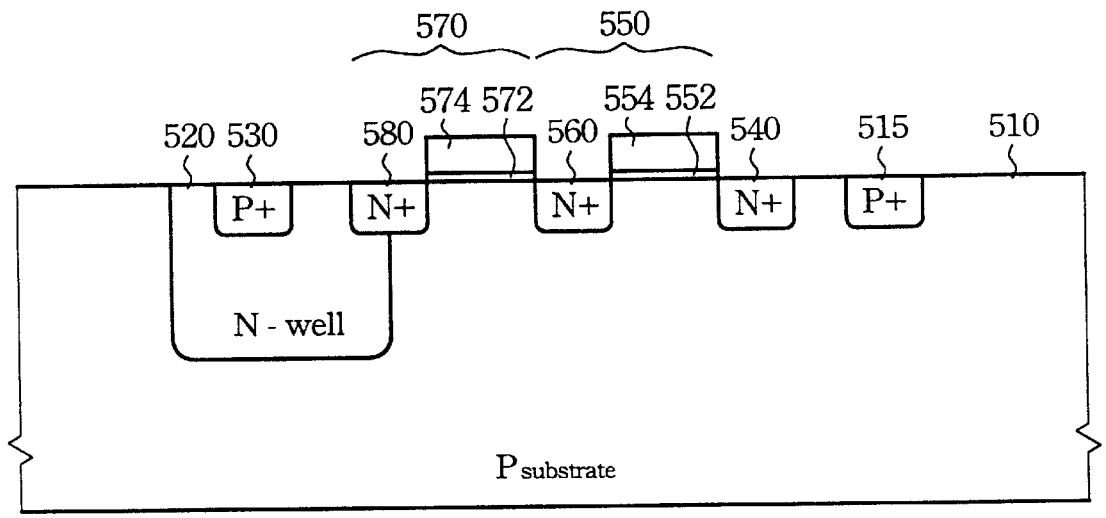
FIG. 5A is a cross-sectional view of a semiconductor wafer illustrating the ESD protection device according to the third embodiment of the present invention.

In addition to the standard LSCR structure, the present invention can also be applied to other modified SCR structure. FIG. 5A illustrates the third embodiment of the present invention in cross-sectional view of a wafer when applied to a floating-well SCR. A P-type doped substrate 510 is provided with an N-type doped well region 520 formed therein. A contact region of the P-type substrate 510 can be optionally formed as the P-type heavily doped region 515. A heavily doped P-type region 530 is formed in the N-type well region 520 to serve as the anode. A heavily doped N-type region 540 is formed in the P-type substrate 510 outside the N-type well region 520 to serve as a cathode. The anode and cathode 530 and 540 are disposed such that N-type region 520 is interposed between P-type regions 510 and 530 while the P-type region 510 is interposed between N-type regions 520 and 540. A floating-well SCR structure is thus formed.

A stacked MOS structure with at least two NMOS transistors 550 and 570 is formed in a cascode configuration on the substrate with the N-type cathode region 540 as a source of the first NMOS transistor 550. These two NMOS transistors 550 and 570 are merged into the same active area and share a common N-type doped region 560 as the drain of the first NMOS transistor 550 as well as the source of the second NMOS transistor 570. The heavily doped N-type drain region 580 of the second transistor 570 is formed at the boundary of the N-type well region 520 and P-type substrate 510. Stacked dielectric film 552 and conductive film 554 are formed on the substrate between regions 540 and 560 to serve as the gate dielectric and gate electrode of the first transistor 550. Stacked dielectric film 562 and conductive film 564 are formed on the substrate between regions 560 and 580 to serve as the gate dielectric and gate electrode of the second transistor 570.

Figure 5B:
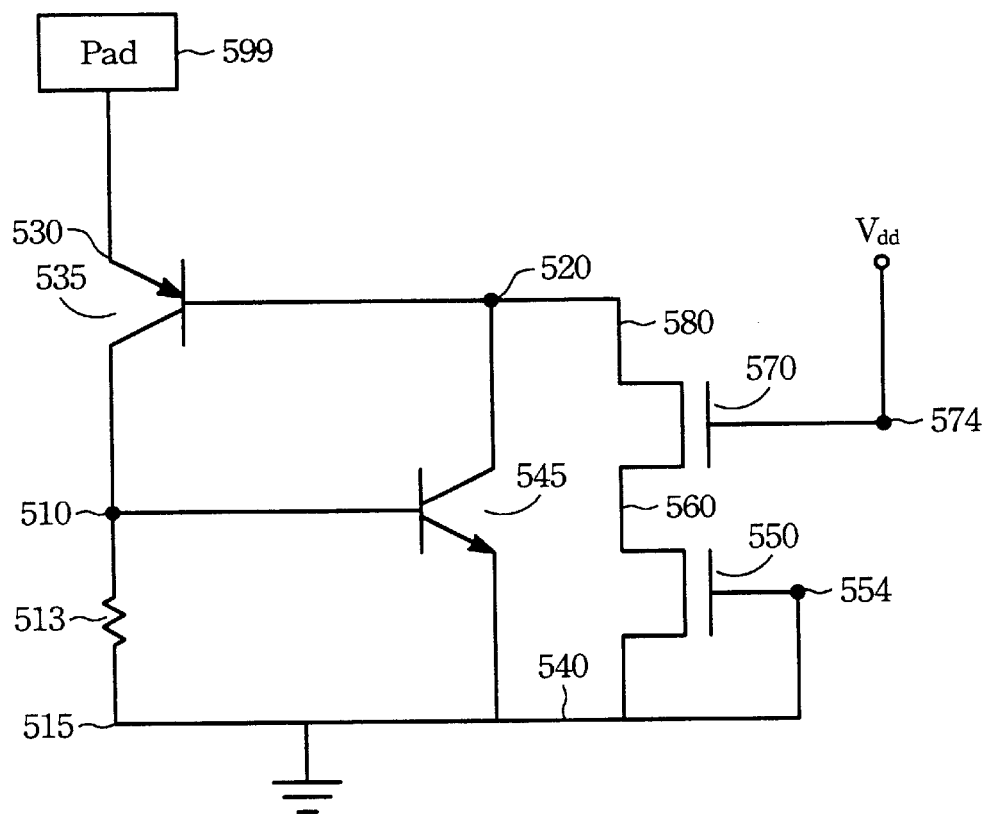
FIG. 5B is the circuit schematic diagram of the ESD protection device according to the third embodiment of the present invention.

The equivalent circuit schematic diagram of the third embodiment is illustrated in FIG. 5B. The floating-well SCR is represented by PNP bipolar transistor 535 and NPN bipolar transistor 545 in a constructive feedback configuration. The P-type substrate 510, N well 520 and P-type anode region 530 respectively serve as the collector, base, and emitter of the PNP bipolar transistor 535. Similarly, the N well 520, P-type substrate 510 and N-type cathode region 540 respectively serve as the collector, base, and emitter of the NPN bipolar transistor 545.

Resistor 513 is contributed by the junction between the P-type substrate 510 and the substrate contact region 515. The two NMOS transistors 550 and 570 are stacked in cascode configuration with the source of the first NMOS transistor 550 coupling to the emitter of the NPN bipolar transistor 545 and the drain 580 of the second NMOS transistor 570 coupling to the base 520 of the PNP bipolar transistor 535. When applied to protect a primary circuit from ESD, this ESD protection circuit can be connected as follows. The emitter 530 of the bipolar transistor 535, serving as the anode of this protection device, is connected to the I/O pad 599. The cathode, including the P-type substrate contact region 515 and the common N-doped region 540 for both SCR and the stacked MOS structure, is grounded. The gate 554 of the first NMOS transistor 550 is also grounded. The gate 574 of the second NMOS transistor 570 is coupling to the low supply voltage (Vdd), either directly or through a transistor network. With the configuration illustrated in FIGS. 5A and 5B, the ESD protection device proposed by the present invention can function in the ESD event and still meet the dielectric and hot carrier reliability limits at a high supply voltage level.

Figure 6A:
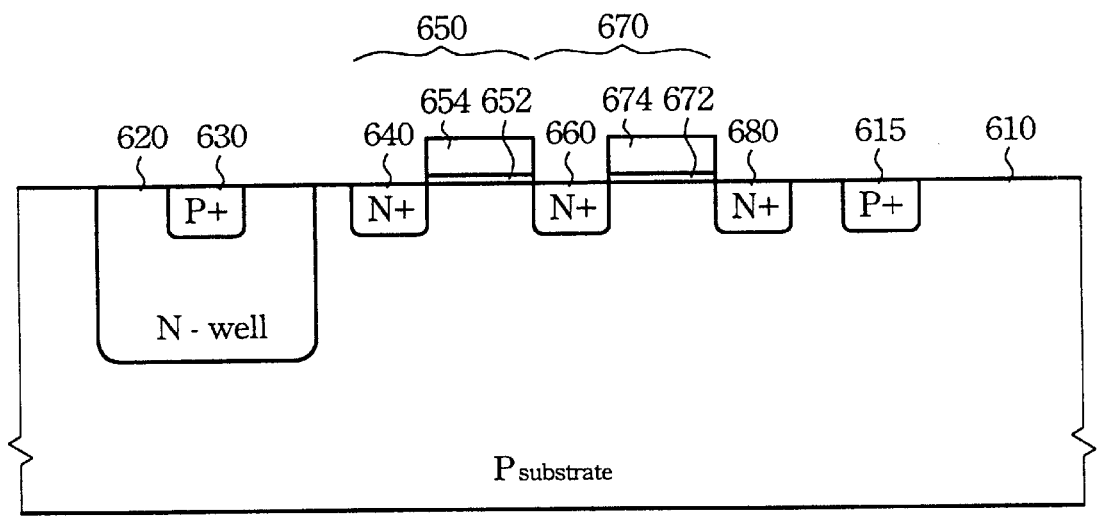
FIG. 6A is a cross-sectional view of a semiconductor wafer illustrating the ESD protection device according to the fourth embodiment of the present invention.

FIG. 6A illustrates the fourth embodiment of the present invention in cross-sectional view of a wafer applying to a floating-well SCR. A P-type doped substrate 610 is provided with an N-type doped well region 620 formed therein. A contact region of the P-type substrate 610 can be optionally formed as the P-type heavily doped region 615. A heavily doped P-type region 630 is formed in the N-type well region 620 to serve as an anode. A heavily doped N-type region 640 is formed in the P-type substrate 610 outside the N-type well region 620 to serve as the cathode. The anode and cathode 630 and 640 are disposed such that N-type region 620 is interposed between P-type regions 610 and 630 while the P-type region 610 is interposed between N-type regions 620 and 640. A floating-well SCR structure is thus formed.

A stacked MOS structure with at least two NMOS transistors 650 and 670 is formed in a cascode configuration on the substrate with the N-type anode region 640 as a source of the first NMOS transistor 650. These two NMOS transistors 650 and 670 are merged into the same active area and share a common N-type doped region 660 as the drain of the first NMOS transistor 650 as well as the source of the second NMOS transistor 670. The heavily doped N-type drain region 680 of the second transistor 670 is formed in the P-type substrate 610 such that the NMOS transistors 650 locates between the N-type well region 620 and N-type drain region 680. Stacked dielectric film 652 and conductive film 654 are formed on the substrate between regions 640 and 660 to serve as the gate dielectric and gate electrode of the first transistor 650. Stacked dielectric film 662 and conductive film 664 are formed on the substrate between regions 660 and 680 to serve as the gate dielectric and gate electrode of the second transistor 670.

Figure 6B:
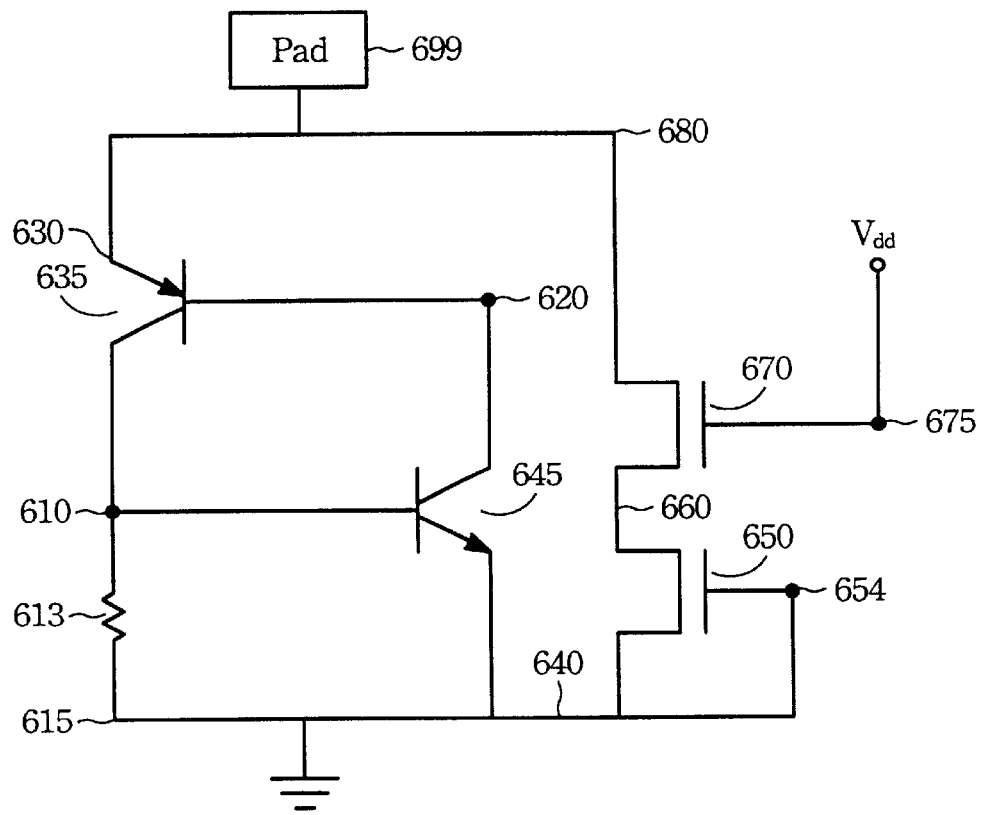
FIG. 6B is the circuit schematic diagram of the ESD protection device according to the fourth embodiment of the present invention.

The equivalent circuit schematic diagram of the fourth embodiment is illustrated in FIG. 6B. The floating-well SCR is represented by PNP bipolar transistor 635 and NPN bipolar transistor 645 in a constructive feedback configuration. The P-type substrate 610, N well 620 and P-type anode region 630 respectively serve as the collector, base, and emitter of the PNP bipolar transistor 635. Similarly, the N well 620, P-type substrate 610 and N-type anode region 640 respectively serve as the collector, base, and emitter of the NPN bipolar transistor 645.

Resistor 613 is contributed by the junction between the P-type substrate 610 and the substrate contact region 615. The two NMOS transistors 650 and 670 are stacked in cascode configuration with the source of the first NMOS transistor 650 coupling to the emitter of the NPN bipolar transistor 645 and the drain 680 of the second NMOS transistor 670 coupling to the emitter 630 of the PNP bipolar transistor 635. When applied to protect a primary circuit from ESD, this ESD protection circuit can be connected as follows. The anode of this protection device, including the emitter 630 of the bipolar transistor 635, the N-well contact region 625, and the drain 680 of the second NMOS transistor 670, is connected to the I/O pad 699. The cathode, including the P-type substrate contact region 615 and the common N-doped region 640 for both SCR and the stacked MOS structure, is grounded. The gate 654 of the first NMOS transistor 650 is also grounded. The gate 674 of the second NMOS transistor 670 is coupling to the low supply voltage (Vdd), either directly or through a transistor network. With the configuration illustrated in FIGS. 6A, 6B, 6C, the ESD protection device proposed by the present invention can function in the LSD event and still meet the dielectric and hot carrier reliability limits at a high supply voltage level.

The present invention can further be modified for applying to a higher trigger current case. For such embodiments, N-type heavily doped guard band can be formed in the N-well region and coupled to the low supply voltage (Vdd). Alternatively, P-type heavily doped guard band can be formed in the P-type substrate outside the N-well region and grounded (coupled to Vss).

Figure 7A:
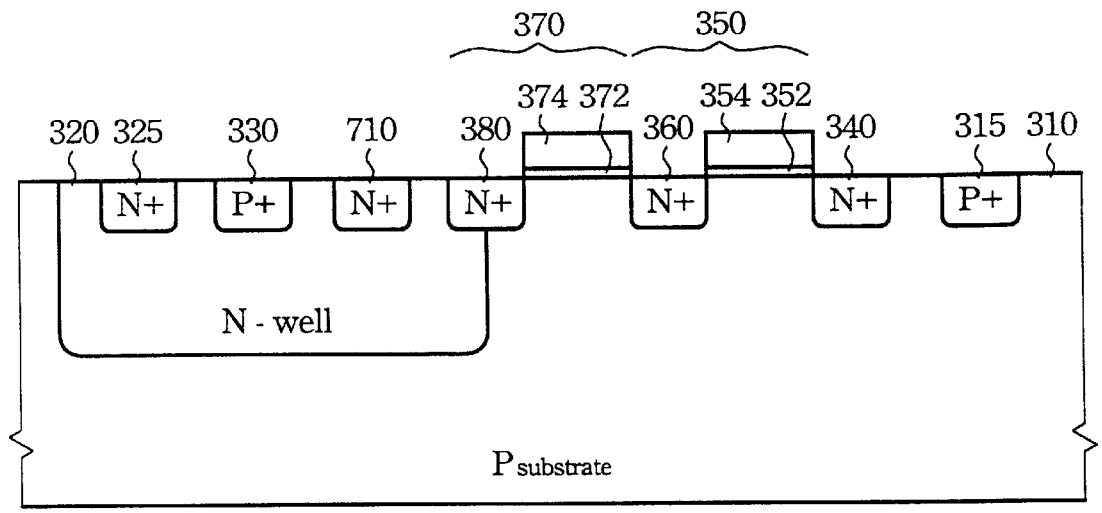
FIG. 7A is a cross-sectional view of a semiconductor wafer illustrating the ESD protection device according to the fifth embodiment of the present invention.

FIG. 7A illustrates the fifth embodiment of the present invention in cross-sectional view of a wafer. In this embodiment, all the elements employed by the first embodiment and shown in FIGS. 3A, 3B and 3C are substantially kept and identified as described above. Addition N-type heavily doped guard band 710 is formed in the N-well region 320 between the P-type heavily doped anode 330 and N-type heavily doped drain region 380 of the second NMOS transistor 370. The latch-up margin is thus increased. When applied to protect a primary circuit from ESD, this ESD protection circuit can be connected as follows. The emitter 330 of the bipolar transistor 335 serves as anode, and is connected to the I/O pad. The P-type substrate contact region 315 and the common N-doped region 340 for both LSCR and the stacked MOS structure, which serve as cathode, are grounded. The N-well contact region 325 and the N-type heavily doped guard band 710 are coupling to the low supply voltage (Vdd), either directly or through a transistor network.

Figure 7B:
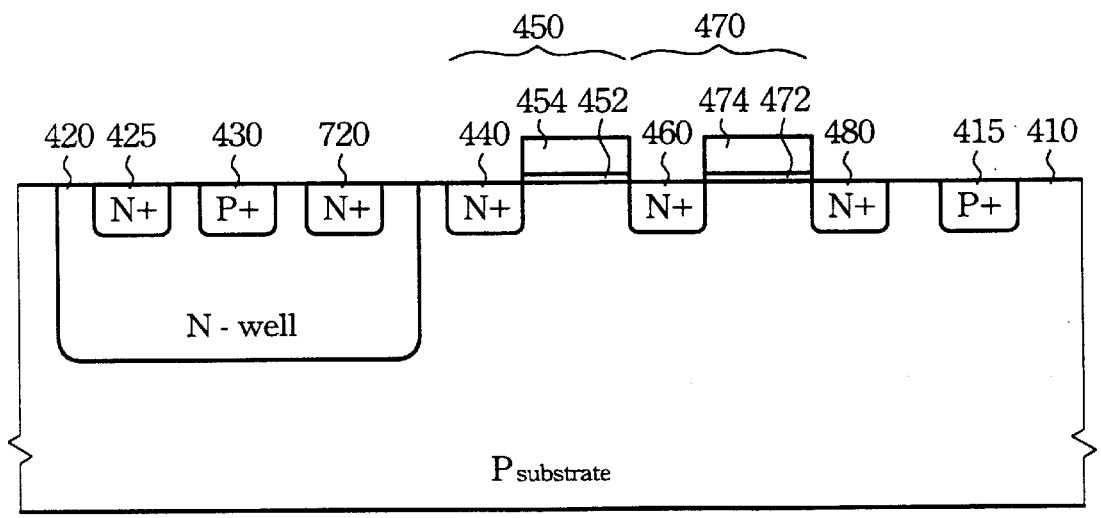
FIG. 7B is a cross-sectional view of a semiconductor wafer illustrating the ESD protection device according to the sixth embodiment of the present invention.

FIG. 7B illustrates the sixth embodiment of the present invention in cross-sectional view of a wafer. In this embodiment, all the elements employed by the second embodiment and shown in FIGS. 4A, 4B and 4C are substantially kept and identified as described above. Addition N-type heavily doped guard band 720 is formed in the N-well region 420 between the P-type heavily doped anode 430 and N-type heavily doped cathode 440. The latch-up margin is thus increased. When applied to protect a primary circuit from ESD, this ESD protection circuit can be connected as follows. The emitter 430 of the bipolar transistor 435 serves as anode, and is connected to the I/O pad. The P-type substrate contact region 415 and the common N-doped region 440 for both LSCR and the stacked MOS structure, which serve as cathode, are grounded. The N-well contact region 425 and the N-type heavily doped guard band 720 are coupling to the low supply voltage (Vdd), either directly or through a transistor network.

Figure 7C:
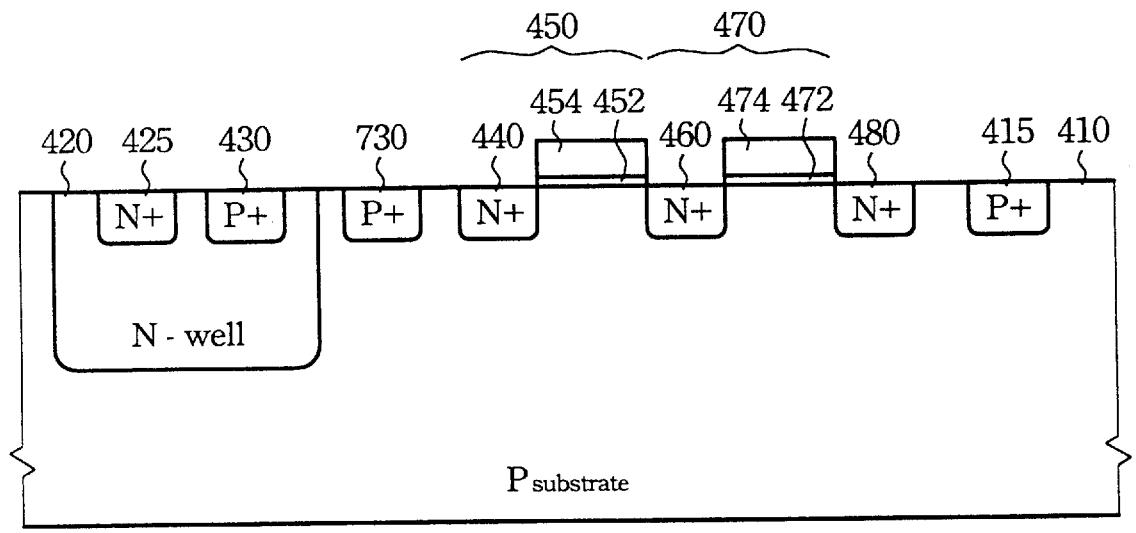
FIG. 7C is a cross-sectional view of a semiconductor wafer illustrating the ESD protection device according to the seventh embodiment of the present invention.

FIG. 7C illustrates the seventh embodiment of the present invention in cross-sectional view of a wafer. In this embodiment, all the elements employed by the second embodiment and shown in FIGS. 4A, 4B and 4C are substantially kept and identified as described above. Addition P-type heavily doped guard band 730 is formed in the P-type substrate 410 between the N-well region 420 and N-type heavily doped cathode 440. The latch-up margin is thus increased. When applied to protect a primary circuit from ESD, this ESD protection circuit can be connected as follows. The emitter 430 of the bipolar transistor 435 serves as anode, and is connected to the I/O pad. The P-type substrate contact region 415 and the common N-doped region 440 for both LSCR and the stacked MOS structure, which serve as cathode, are grounded. The P-type heavily doped guard band 730 is also grounded. The N-well contact region 425 is coupling to the low supply voltage (Vdd), either directly or through a transistor network.

Figure 7D:
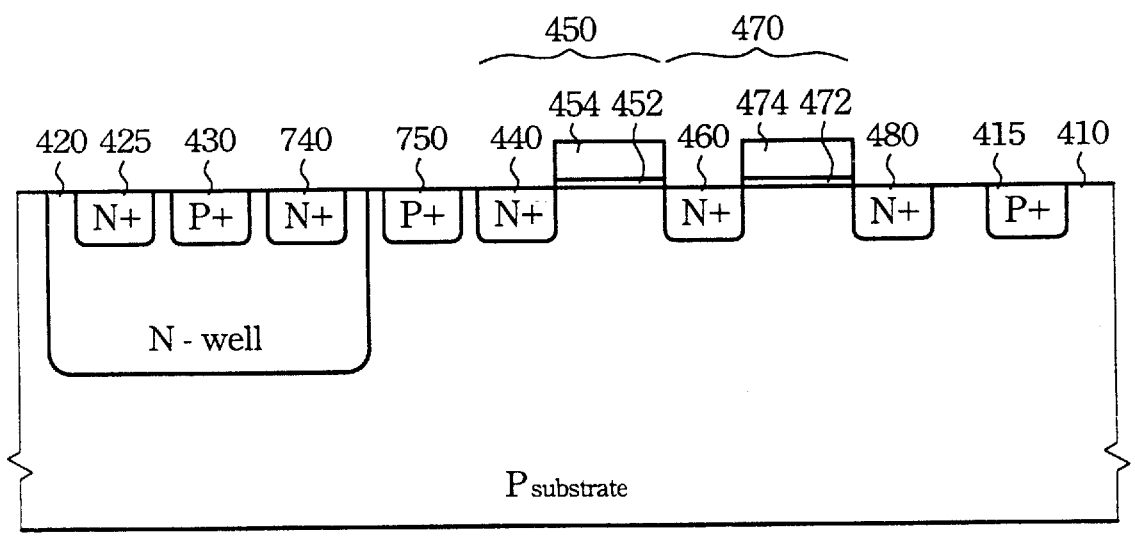
FIG. 7D is a cross-sectional view of a semiconductor wafer illustrating the ESD protection device according to the eighth embodiment of the present invention.

FIG. 7D illustrates the eighth embodiment of the present invention in cross-sectional view of a wafer. In this embodiment, all the elements employed by the second embodiment and shown in FIGS. 4A, 4B and 4C are substantially kept and identified as described above. Addition P-type heavily doped guard band 750 is formed in the P-type substrate 410 between the N-well region 420 and N-type heavily doped cathode 440. Addition N-type heavily doped guard band 740 is formed in the N-well region 420 between the P-type heavily doped anode 430 and the P-type heavily doped guard band 750. The latch-up margin is thus increased. When applied to protect a primary circuit from ESD, this ESD protection circuit can be connected as follows. The emitter 430 of the bipolar transistor 435 serves as anode, and is connected to the I/O pad. The P-type substrate contact region 415 and the common N-doped region 440 for both LSCR and the stacked MOS structure, which serve as cathode, are grounded. The P-type heavily doped guard band 750 is also grounded. The N-well contact region 425 and the N-type heavily doped guard band 740 are coupling to the low supply voltage (Vdd), either directly or through a transistor network.

Applying the ESD protection device proposed by the present invention, the primary circuit of a chip can be protected from damage caused by ESD event, and the voltage tolerance can be significantly increased. The SCR structure provides a robust base ESD protection circuit with the MOS transistors providing trigger current at a lower trigger voltage. The employment of the stacked MOS transistors in a cascode configuration prevent the protection device itself from harming by high supply voltage, and ensures the dielectric and hot carrier reliability in a mixed voltage application.

Furthermore, above increase of voltage tolerance can be achieved without any extra manufacture process. All the fabrication of the present ESD protection device can be accomplished simultaneously as the primary circuit is made. Any element in the present ESD protection device adopts the same design rule as the primary circuit. No extra processes, such as higher dosage ion implantation for higher concentration doped regions, or longer-time oxide deposition or oxidation for a thicker gate oxide film, is necessary. The ESD protection device can be implemented effectively and economically for the mixed voltage application.

As is understood by a person who is skilled in the art, the foregoing preferred embodiments of the present invention are illustrated of the present invention rather than limiting of the present invention. It is intended to cover various modifications and similar arrangements included within the spirit and scope of the appended claims, such as using more than two MOS transistors in the cascode configuration, or exchanging the conductive type (N-type or P-type) of each doped region to adapt for a N-type substrate. The scope of such modifications should be accorded the broadest interpretation so as to encompass all such modifications and similar structure.

What is claimed is:

1. An electrostatic discharge protection device which may meet the dielectric and hot carrier reliability limits when applied to protect the mixed voltage application, said device comprising:
   a semiconductor-controlled rectifier formed in a semiconductor layer of first conductive type, said semiconductor-controlled rectifier comprising:
      a well region of second conductive type formed in said semiconductor layer;
      a first region of first conductive type formed in said well region; and
      a second region of second conductive type formed in said semiconductor layer and spaced from said well region; and
   a MOS structure formed in a cascode configuration comprising at least two MOS transistors, said MOS structure being formed in said semiconductor layer such that said semiconductor-controlled rectifier is triggered by a current generated when said MOS structure is in avalanche breakdown.

2. The device of claim 1, wherein said stacked MOS structure is formed on one active area.

3. The device of claim 1, wherein said semiconductor-controlled rectifier further comprising a substrate contact region of first conductive type formed in said semiconductor layer.

4. The device of claim 1, wherein said semiconductor-controlled rectifier further comprising a well contact region of second conductive type formed in said well region.

5. The device of claim 1, wherein said semiconductor-controlled rectifier further comprising a substrate guard-band region of first conductive type formed in said semiconductor layer and located between said first region and said well region.

6. The device of claim 1, wherein said semiconductor-controlled rectifier further comprising a well guard-band region of second conductive type formed in said well region and located between said first region and said second region.

7. The device of claim 1, wherein said MOS structure comprising a first MOS transistor formed on said semiconductor layer, said first MOS transistor comprising:
said second region serving as a source/drain region;
a third region of second conductive type formed in said semiconductor layer between said second region and said well region to serve as a source/drain region;
a first gate region formed on said semiconductor layer between said second region and said third region; and
a first gate dielectric formed between said semiconductor layer and said first gate region.

8. The device of claim 7, wherein said MOS structure further comprising a second MOS transistor formed on said semiconductor layer between said first MOS transistor and said well region.

9. The device of claim 8, wherein said second MOS transistor comprising a fourth region of second conductive type formed in said semiconductor layer and partially overlapping said well region.

10. The device of claim 8, wherein said second MOS transistor also comprising said third region of second conductive type serving as a source/drain region.

11. The device of claim 1, wherein said MOS structure comprising a first MOS transistor, said first MOS transistor comprising:
said second region serving as a source/drain region;
a third region of second conductive type formed in said semiconductor layer to serve as a source/drain region such that said second region locates between said well region and said third region;
a first gate region formed on said semiconductor layer between said second region and said third region; and
a first gate dielectric formed between said semiconductor layer and said first gate electrode.

12. The device of claim 11, wherein said MOS structure further comprising a second MOS transistor formed on said semiconductor layer such that said first MOS transistor locates between said second MOS transistor and said well region.

13. The device of claim 12, wherein said second MOS transistor also comprising said third region of second conductive type serving as a source/drain region.

14. An electrostatic discharge protection device arranged to meet the dielectric and hot carrier reliability limits when applied to protect a mixed voltage application, said device comprising:
a semiconductor layer of first conductive type;
a well region of second conductive type formed in said semiconductor layer;
a first region of first conductive type formed in said well region;
a second region of second conductive type formed in said semiconductor layer and spaced from said well region;
a first MOS transistor formed on said semiconductor layer, said first MOS transistor comprising:
said second region serving as a source/drain region;
a third region of second conductive type formed in said semiconductor layer between said second region and said well region to serve as a source/drain region;
a first gate region formed on said semiconductor layer between said second region and said third region; and
a first gate dielectric formed between said semiconductor layer and said first gate electrode;
a second MOS transistor formed on said semiconductor layer between said first MOS transistor and said well region, said second MOS transistor formed in a cascode configuration with said first MOS transistor on one active area.

15. The device of claim 14, wherein said discharge protection device further comprising a substrate contact region of first conductive type formed in said semiconductor layer.

16. The device of claim 14, wherein said discharge protection device further comprising a well contact region of second conductive type formed in said well region.

17. The device of claim 14, wherein said discharge protection device further comprising a substrate guard-band region of first conductive type formed in said semiconductor layer and located between said first region and said well region.

18. The device of claim 14, wherein said discharge protection device further comprising a well guard-band region of second conductive type formed in said well region and located between said first region and said second region.

19. The device of claim 14, wherein said second MOS transistor comprising a fourth region of second conductive type formed in said semiconductor layer and partially overlapping said well region.

20. The device of claim 14, wherein said second MOS transistor also comprising said third region of second conductive type serving as a source/drain region.

21. An electrostatic discharge protection device which may meet the dielectric and hot carrier reliability limits when applied to protect the mixed voltage application, said device comprising:
a semiconductor layer of first conductive type;
a well region of second conductive type formed in said semiconductor layer;
a first region of first conductive type formed in said well region;
a second region of second conductive type formed in said semiconductor layer and spaced from said well region;
a first MOS transistor formed on said semiconductor layer, said first MOS transistor comprising:
said second region serving as a source/drain region;
a third region of second conductive type formed in said semiconductor layer to serve as a source/drain region such that said second region locates between said well region and said third region;
a first gate region formed on said semiconductor layer between said second region and said third region; and a first gate dielectric formed between said semiconductor layer and said first gate electrode;

a second MOS transistor formed on said semiconductor layer such that said first MOS transistor locates between said second MOS transistor and said well region, said second MOS transistor formed in a cascode configuration with said first MOS transistor on one active area.

22. The device of claim 21, wherein said discharge protection device further comprising a substrate contact region of first conductive type formed in said semiconductor layer.

23. The device of claim 21, wherein said discharge protection device further comprising a well contact region of second conductive type formed in said well region.

24. The device of claim 21, wherein said discharge protection device further comprising a substrate guard-band region of first conductive type formed in said semiconductor layer and located between said first region and said well region.

25. The device of claim 21, wherein said discharge protection device further comprising a well guard-band region of second conductive type formed in said well region and located between said first region and said second region.

26. The device of claim 21, wherein said second MOS transistor also comprising said third region of second conductive type serving as a source/drain region.

* * * * *